United States Patent [19]
Yamauchi

[11] Patent Number: 5,229,964
[45] Date of Patent: Jul. 20, 1993

[54] READ CIRCUIT FOR LARGE-SCALE DYNAMIC RANDOM ACCESS MEMORY

[75] Inventor: Hiroyuki Yamauchi, Osaka, Japan

[73] Assignee: Matsushita Electric Industrial Co., Ltd., Osaka, Japan

[21] Appl. No.: 617,873

[22] Filed: Nov. 26, 1990

[30] Foreign Application Priority Data

Nov. 24, 1989 [JP] Japan ............................. 1-306246

[51] Int. Cl.⁵ .............................................. G11C 7/00
[52] U.S. Cl. .............................. 365/189.01; 365/190; 365/230.06
[58] Field of Search ............ 365/189.01, 190, 230.06, 365/195

[56] References Cited
U.S. PATENT DOCUMENTS

| | | | |
|---|---|---|---|
| 4,168,539 | 9/1979 | Anderson | 365/190 |
| 4,839,868 | 6/1989 | Sato et al. | 365/230.06 |
| 4,916,668 | 4/1990 | Matsui | 365/230.06 X |
| 5,005,154 | 4/1991 | Masuda | 365/230.06 |
| 5,050,127 | 9/1991 | Mitsijmoto et al. | 365/190 X |

FOREIGN PATENT DOCUMENTS

| | | |
|---|---|---|
| 0179436 | 4/1986 | European Pat. Off. |
| 0230024 | 7/1987 | European Pat. Off. |
| 1922842 | 12/1969 | Fed. Rep. of Germany |
| 1769847 | 11/1971 | Fed. Rep. of Germany |

Primary Examiner—Eugene R. LaRoche
Assistant Examiner—Son Dinh
Attorney, Agent, or Firm—Pollock, VandeSande & Priddy

[57] ABSTRACT

A circuit for reading and writing data to/from memory cells of a DRAM, based upon sense amplifiers formed of N-type and P-type FETs for each pair of bit lines of the DRAM and column switches formed of FETs for transferring data potentials to/from the bit line pairs, in which the current drive capability of the column switches is increased relative to the sense amplifiers during each write cycle and the current drive capability of the sense amplifiers is increased relative to that of the column switches during each read cycle, thereby ensuring satisfactory read and write operation even for a very large-scale DRAM operating with a low value of supply voltage.

12 Claims, 13 Drawing Sheets

$V_{g2} - V_{s2} = V_{t2}$    $V_{g1} - V_{s1} = V_{t1}$

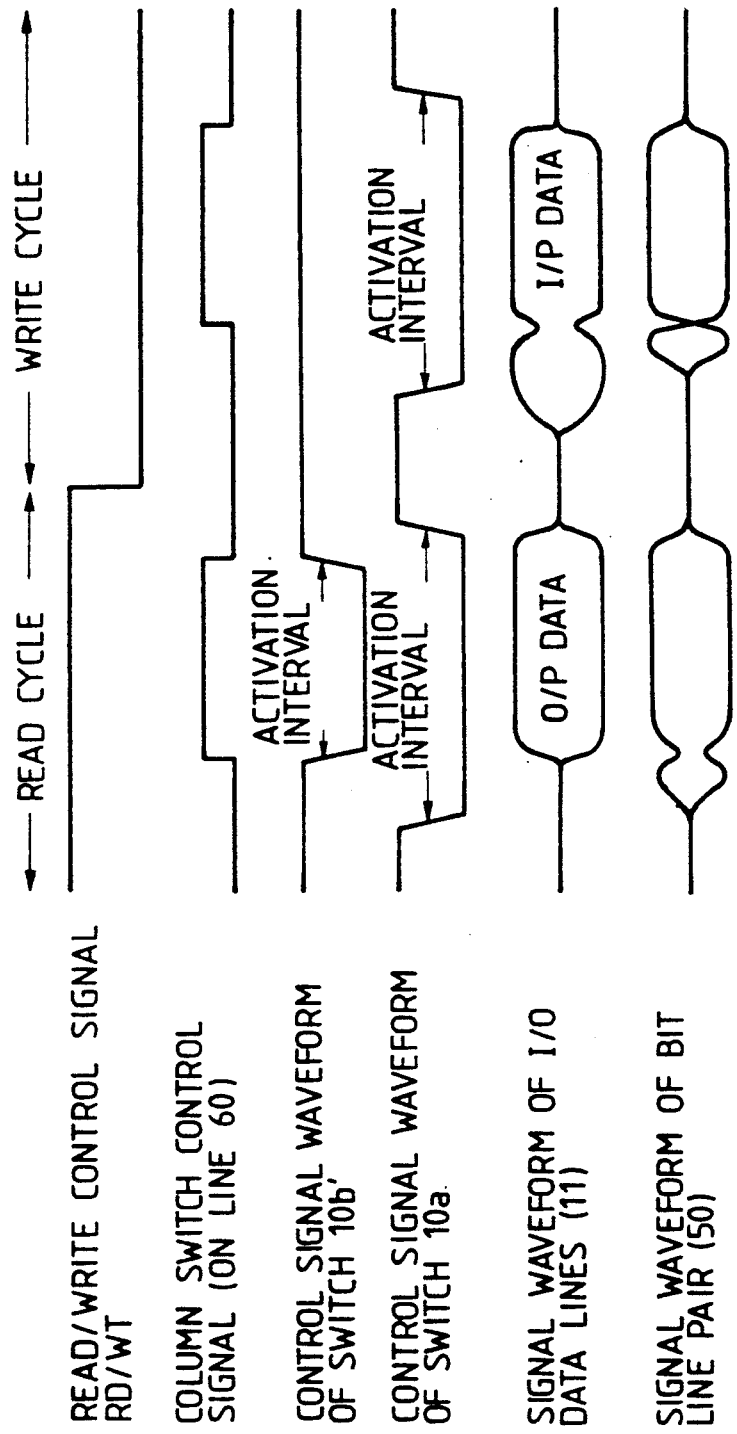

READ CIRCUIT FOR LARGE-SCALE DYNAMIC RANDOM ACCESS MEMORY

BACKGROUND OF THE INVENTION

1. Field of Application

The present invention relates to a circuit for executing data read and write operations in a DRAM (dynamic random access memory). In particular, the invention relates to improvements to such circuits whereby satisfactory read and write operation can be achieved even in the case of a DRAM which is formed as a large-scale integrated circuit having very high component density and which is operated with a low value of supply voltage.

2. Prior Art Technology

FIG. 1 shows an example of a prior art circuit for executing read and write operations (referred to in the following simply as a read circuit) in a DRAM that is implemented as a large-scale integrated circuit (LSI), which will be described for assistance in understanding the problems that are to be overcome by the present invention. In this example, P-type MOS and N-type MOS field effect transistors (respectively referred to in the following simply as PMOS FETs and NMOS FETs) are utilized as circuit elements. Numerals 50 denote respective pairs of bit lines, each of the bit lines being coupled to respective ones of an array of memory cells 5, and each of the bit line pairs being provided with a sense amplifier 1 which consists of an NMOS flip-flop circuit (formed of a pair of NMOS FETs connected in series between the pair of bit lines) and a sense amplifier 2 which consists of a PMOS flip-flop (formed of a pair of PMOS FETs connected between the pair of bit lines). In addition, each pair of bit lines 50 is coupled to a corresponding pair of switches 3 referred to as column switches (since the pairs of bit lines 50 successively extend along a column direction of an array of the memory cells 5), with each column switch in this example being formed of an NMOS FET, through which data can be transferred to or from the pair of bit lines during a write or read operation respectively. A word line 4 is connected to respective control electrodes of the memory cells 5 of one bit line in each pair of bit lines 50, while a word line 5 is similarly connected to respective control electrodes of the memory cells 5 of the other bit line of each pair of bit lines 50. Respective column address decoding circuits 6 are provided for each of the pairs of bit lines 50, which are connected to the gate electrodes of the column switches 3 of that pair. Each of the column address decoding circuits 6 produces a column address signal on a control line 60 at a high potential when the corresponding pair of bit lines is selected for data reading or writing to/from a memory cell A common voltage supply line 7 is coupled to each of the common source connection points of the NMOS sense amplifier flip-flops 1, while a common voltage supply line 8 is similarly coupled to each of the PMOS sense amplifier flip-flops 2. 9 is a switch for selectively connecting the common voltage supply line 7 to ground (i.e. 0 V) potential, while a switch 9 similarly selectively connects the supply line 8 to the Vcc supply potential. The voltage supply switch 9 in this example is formed of a pair of NMOS FETs connected in parallel, and the voltage supply switch 10 is similarly formed of a pair of PMOS FETs. Control of activation of the NMOS sense amplifier flip-flops 1 by the common voltage supply line 7 (by connecting that lead to ground potential) is executed by a control signal SEN that is supplied to the voltage supply switch 9, i.e. that signal goes to an active (high) potential to activate the common voltage supply line 7. Similarly, control of activation of the PMOS sense amplifier flip-flops 2 by the common voltage supply line 8 (by connecting that lead to the Vcc supply potential) is executed by a control signal SEP supplied to the voltage supply switch 10, i.e. that signal goes to an active (low) potential to activate the common voltage supply line 8. One line of a pair of input/output data lines 11 can be selectively connected through respective column switches 3 to one line of each of the pairs of bit lines 50, while the other one of the input/output data lines 11 can similarly be connected through column switches 3 to the other line of each pair of bit lines 50. Connection of a pair of bit lines 50 to the input/output data lines 11 is controlled by the corresponding column address signal, which is applied as a switch control signal to the gate electrodes of the column switches 3 of that pair of bit lines 50.

The operation of this prior art example will be described referring to FIG. 1 in conjunction with the waveform diagrams of FIGS. 2 and 3, which illustrate a memory read cycle and write cycle respectively. A read cycle will be described first, and it will be assumed that the word line 4 is selected, i.e. that the contents of the memory cells that are coupled to the word line 4 are to be read out. The waveforms shown apply to any one of the pairs of bit lines 50 together with the sense amplifier flip-flops 1 and 2, column switches 3, and the column address decoder circuit 6 corresponding thereto. Initially, each of the bit lines is at a pre-charge potential that is equal to one half of the supply voltage value, i.e. Vcc/2, as are also the input/output data lines 11. Firstly, at time point t0, the potential of the selected word line begins to increase. Next, at the time point t1, the electrical charge that has been stored in the memory cell 5 that is to be read (i.e. the memory cell located at the intersection of the word line 4 and that pair of bit lines 50 in FIG. 1) is outputted to one of the bit lines of the pair. It is assumed in FIG. 2 that this read operation results in an increase in potential of the pair of bit lines that is connected to the memory cell, indicating that a "1" state bit was stored therein. Next, at time point t2, the common voltage supply line 7 becomes connected through the voltage supply switch 9 to ground potential (due to the control line SEN going to its active potential), so that the potential of the common voltage supply line 7 begins to fall. When that potential falls to a certain level as described hereinafter in detail, the NMOS sense amplifier flip-flop 1 becomes activated, so that amplification of the potential difference between the pair of bit lines 50 begins. More specifically, assuming that a "1" bit is read from the memory cell designated as 5' in FIG. 1, discharging of the bit line designated as 50a, through the NMOS FET designated as 1a, will begin after time point t2. The potential of that line 50a will thereby fall rapidly, i.e. the potential difference between that pair of bit lines 50 will begin to be amplified by the "pulldown" action of that NMOS sense amplifier flip-flop. Next, at time point t3, the control signal SEP acts on the voltage supply switch 10 to begin applying the supply voltage Vcc to the common voltage supply line 8, so that the potential of the common voltage supply line 8 begins to rise When that increase has reached a certain point, the PMOS sense amplifier flip-flop 2 will be activated, so that charging of the bit line designated as 50b, through the PMOS FET designated as 2a, will begin. Thus, the bit line 50a will fall towards the ground potential, and bit line 50b will rise towards the Vcc level, as a result of the amplification of the sense amplifier flip-flops 1 and 2 in combination. Next, at time point t4, the column address signal from the column address decoder circuit 6 of that pair of bit lines 50 causes the potential of the control lead 60 to increase, whereby the column switches 3 begin to connect the pair of bit lines 50 to the input/output data lines 11, i.e. to transfer the data of that pair of bit lines to the input/output data lines 11. In this example in which a "1" bit is assumed to be read out from the memory cell 5', a charging current (supplied from the PMOS FET 2a) will flow via one of the column switches 3 into the input/output data lines 11 (which have a substantially higher value of capacitance than each of the pairs of bit lines 50) from the bit line 50b, and a discharging current will similarly flow from the input/output data lines 11 via a switch 3 and the bit line 50a into the NMOS FET 1a. The data which are thus transferred from the memory cells 5 to the input/output data lines 11 are then transferred to external circuits through a data buffer (not shown in the drawing).

The operation during a write cycle will be described referring to FIG. 1 and the waveform diagram of FIG. 3. In this case, the operations which occur at time points t0, t1 and t2 are identical to those of the read cycle described hereinabove referring to FIG. 2. It will again be assumed that the word line 4 is activated. For ease of understanding, the operation of writing a "0" state bit into the memory cell 5' of the pair of bit lines 50a, 50b will be described, assuming that a "1" state bit is held in that memory cell before the write cycle begins. After the time point t3 as described hereinabove, a charging current is supplied through the PMOS FET 2a to the bit line 50b and a discharging current through the NMOS FET 1a to the bit line 50a, causing the potential difference between that pair of bit lines to be amplified. However, during a write cycle, a potential difference is established between the input/output data lines 11 prior to the time point t4 at which the column address signal of that pair of bit lines goes to the active (high) level, with the polarity of that potential difference being determined in accordance with whether a "1" or "0" bit is to be written. The respective FETs of the NMOS sense amplifier flip-flops 1, PMOS sense amplifier flip-flops 2 and column switches 3 should be configured (as described in detail hereinafter) such that when the input/output data lines 11 become connected to the pair of bit lines 50a, 50b following the time point t4. And the amplified voltage difference between the pair of bit lines is cancelled by the voltage difference between the input/output data lines 11, i.e a current flow will occur from the input/output data lines 11 into that pair of bit lines through the column switches 3, of sufficient magnitude to overcome the effects of the current supplied from the NMOS sense amplifier flip-flop 1 and PMOS sense amplifier flip-flop 2. As a result, the respective stable states of the sense amplifier flip-flops 1 and 2 of the pair of bit lines 50a, 50b are inverted, causing the bit line waveform to be inverted as shown in FIG. 3, so that the potential difference between that pair of bit lines now corresponds to a "0" bit state. Since at that time the word line 4 is still at the active level, a "0" bit is written into the memory cell 5' in this example.

However, as DRAMs have been developed which have a very high component density and high storage capacity, there is a trend towards using a lower value of supply voltage (Vcc), in order to reduce the overall power consumption and to achieve improved device reliability. For that reason, with a typical very high storage capacity DRAM, e.g. a 16 M bit DRAM, a voltage value Vcc of 3.5 V is generally used, rather than the value of 5.0 V which has been usual in previous types of DRAM. Thus, with a method of sense amplifier operation as described above in which a precharge voltage level of ½ Vcc is used, the operating voltages of the sense amplifier flip-flops 1 and 2 is excessively low. Specifically, with such a ½ Vcc sense amplifier method, the precharge voltage (i.e. the voltage of each pair of bit lines immediately prior to a read or write cycle) will be only approximately 1.65 V if the supply voltage is 3.35 V.

The problem which arises in that case will be described referring to the waveform diagram of a read cycle shown in FIG. 4, and FIG. 5 which is a conceptual diagram for illustrating gate-to-source potentials in a FET of an NMOS sense amplifier flip-flop 1 in the read cycle. It will again be assumed for ease of understanding that the description relates to the pair of bit lines 50a, 50b, memory cell 5' and related components shown in FIG. 1. In FIG. 4, the full-line portions of the pair of bit lines waveform are for the case in which a "1" bit is read out of the memory cell 5', while the broken-line portions are for the case in which a "0" bit is read. When a "1" bit is read, the potential of bit line 50b rises by the amount $\Delta VH$ as shown, and thereafter the potential of the common voltage supply line 7 begins to fall from the ½ Vcc level towards 0 V, thereby pulling down the potential of the source electrode of FET 1a of flip-flop 1. When the difference between the gate and source of FET 1a reaches the NMOS FET threshold voltage (i.e. the voltage difference $(Vg2-Vs2)=Vt2$ shown in FIG. 5 becomes equal to that threshold voltage) then current begins to flow through the FET 1a, thereby pulling the potential of bit line 50a towards 0 V. Similarly, current begins to flow through transistor 2a of the sense amplifier flip-flop 2, pulling up the bit line 50b towards Vcc, so that the potential difference between the bit lines is rapidly amplified as shown.

However if a "0" bit is read from the memory cell 5', then the potential of bit line 50b will initially fall by the amount $\Delta VL$ shown in FIG. 4. Thereafter, as the source potential of FET 1a is pulled down by current flowing through the common voltage supply line 7 and voltage supply switch 9, a point t11 is reached at which the potential difference between the gate and source of FET 1b reaches the NMOS FET threshold voltage (i.e. the voltage difference $(Vg1-Vs1)=Vt1$ shown in FIG. 5 becomes equal to that threshold voltage). The potential of the bit line 50b then begins to be pulled down towards 0 V by current flow through the FET 1b, so that amplification of the potential difference between these bit lines by the sense amplifier flip-flops 1 and 2 then begins. However, in this case the gate potential of FET 1b is initially ½ Vcc, (rather than ½ Vcc+$\Delta VH$, as occurs when a "1" state bit is read), so that as illustrated in FIG. 4 there is a delay time $t_d$ between the start of amplification of the potential difference between the bit line pair 50, for the case of a "0" bit being read, by comparison with the case of a "1" bit being read.

In a very large-scale DRAM, each common voltage supply line 7 is connected to the sense amplifier flip-flops of a large number of pairs of bit lines (e.g. typically 1024 bit lines) and so has a high value of capacitance, and due to its length, has a substantial amount of resistance. This, together with the low value of ½ Vcc in such a DRAM (e.g. 1.65 V), results in a low rate of fall of voltage of the common voltage supply line 7 from ½ Vcc towards 0 V during a write cycle, thereby increasing the amount of the delay time $t_d$, so that the problem becomes increasingly severe as the DRAM memory capacity is increased. Moreover, in general, there will be a number of memory cells from which a "1" bit is read at the same time during a read cycle, whose sense amplifiers are supplied in common by the same common voltage supply line 7. This will result in a reduction of the rate of fall of voltage of the common voltage supply line 7 after the time point t10 in FIG. 14, since large amounts of current will then begin to flow into the common voltage supply line 7 from the NMOS sense amplifier flip-flops of the pairs of bit lines on which a "1" bit has been read. Thus if a "0" bit is read from only a small proportion of these memory cells, the problem of a delay in read-out of the "0" bits by comparison with "1" state bits will be further aggravated substantially. As a result of that delay, there is a possibility of unreliability of read operation, i.e. when a "0" state bit is read, the level of pair of bit lines potential difference amplification by the sense amplifier at the time of connection of the pair of bit lines to the input/output data lines 11 via the column switches 3 may be insufficient, as is illustrated by the broken-line waveform in FIG. 4.

One possible approach to overcoming this delay problem would be to design the FETs of the PMOS sense amplifier flip-flops 2 to have a higher value of current drive capability. However, in a conventional type of DRAM read circuit, NMOS FETs are used as the column switches 3, and it is necessary for these to have a higher level of current drive capability than the FETs of the PMOS sense amplifier flip-flops. Here, the term "current drive capability" signifies the level of current that can be transferred through the FET, (i.e. which can be increased by increasing the gate drive voltage, with a specific design of FET, or can be increased by changing the design of the FET, with a specific value of gate voltage).

The reasons making it necessary for the FETs of the column switches 3 to have a higher current drive capability than those of the flip-flops 1 are as follows. During a write cycle as described hereinabove referring to FIG. 3, prior to the time point t4 in FIG. 3, the NMOS sense amplifier ff1 of each pair of bit lines 50 is amplifying a potential difference between the bit lines whose polarity is determined in accordance with whether a "1" or "0" bit was stored in the corresponding memory cell 5. Following time point t4, if the previously stored bit in that memory cell 5 is to be inverted by the write operation, it is necessary for the drive current that is supplied through the column switches 3 to forcibly invert the respective states of the NMOS and cmos sense amplifier flip-flops 1 and 2 of that pair of bit lines. As a specific example, if a "0" state bit was previously stored in the memory cell 5', so that at time point t4 the PMOS FET 2b is connecting the pair of bit lines 50a to the common voltage supply line 8, then designating the uppermost column switch in FIG. 1 as 3a, it will now be necessary for the column switch 3a to supply a drive current of sufficient magnitude to cancel the current that can be transferred through the FET 2b. However if the PMOS FETs have a higher current drive capability than the NMOS FETs that constitute the column switches 3, then it will be difficult to rapidly and reliably execute such cancellation of the previous drive states of the sense amplifier flip-flops during a write cycle. Thus, the aforementioned delay problem cannot be overcome simply by modifying the configuration of the PMOS FETs in the sense amplifier flip-flops with respect to the NMOS fets.

If, on the other hand it were attempted to overcome this problem by increasing the current drive capability of both the NMOS FETs and PMOS FETs, then this would result in an increased level of junction capacitance of the column switches 3, since the NMOS FETs would necessarily be made of larger size. As a result, there would be a corresponding increase in the effective capacitance value of the input/output data lines 11, whose main constituents are the junction capacitances of the column switches 3. Generally, the capacitance of the input/output data lines 11 is approximately 10 times that of each of the pairs of bit lines 50, and if it were to be increased beyond that ratio, there would be a danger that the potential changes occurring on the bit lines during a read cycle (i.e. constituting data that are to be read) would be excessively attenuated by absorption in the capacitance of the input/output data lines 11, when transferred thereto through the column switches 3. Thus, reliable read operation could not be achieved, since bit line potential changes would not be transferred with sufficient speed to the input/output data lines 11.

It can thus be understood that with a prior art DRAM sense amplifier circuit, there is a basic conflict between the respective requirements for high performance during a read cycle and a write cycle. In a read cycle, it is preferable that the FETs used for the column switches 3 have a low value of junction capacitance, and hence are of small size and thus have a low level of current drive capability. In addition, during a read cycle, it is preferable that the FETs used for the sense amplifier flip-flops, including those which are of opposite type to the FETs used for the column switches 3, should have a high value of current drive capability. On the other hand, during a write cycle, the junction capacitance of the column switches 3 is not a significant factor, and it is preferable that the FETs used for the column switches 3 have a higher current drive capability than the FETs which constitute the sense amplifier flip-flop of opposite conduction type to the FETs of the column switches 3.

Thus, it is not possible to overcome the aforementioned delay problem simply by modifying the configurations of the transistors constituting the sense amplifiers and column switches.

That problem will become increasingly severe in future, as increasingly high degrees of integration are utilized to configure high memory capacity DRAMs which utilize a low value supply voltage Vcc, e.g. 3.3 V.

SUMMARY OF THE INVENTION

It is an objective of the present invention to overcome the disadvantages of the prior art as set out above, by providing a DRAM sense amplifier circuit whereby reliable operation is achieved during both read and write cycles and which is applicable to a large-scale DRAM operating with a low value supply voltage.

To achieve the above objectives the present invention provides a sense amplifier circuit for a DRAM, comprising a plurality of sense amplifiers connected to respective ones of a plurality of pairs of bit lines coupled to respective memory cells of the DRAM, column switches for selectively connecting the pairs of bit lines to input/output data lines, and column address generating means for supplying column address signals to control selection operation by the column switches, wherein during a write cycle of the DRAM, the current drive capability of the sense amplifiers or the current drive capability of the column switches is changed with respect to the current drive capability during a read cycle of the DRAM.

More specifically, according to a first aspect, the present invention provides a read circuit for reading and writing data to and from memory cells of a DRAM, said DRAM including a plurality of pairs of bit lines each coupled to said memory cells, input and output data lines for transferring data between said pairs of bit lines and external circuits, and means for generating column address control signals for use in selectively connecting said pairs of bit lines to said input and output data lines, said read circuit comprising:

- a plurality of column switches controlled by said control signals, for transferring data between said pairs of bit lines and input/output data lines;
- a plurality of sense amplifiers each coupled to a corresponding one of said pairs of bit lines; and
- means for establishing respectively different values of amplitude of said control signals in accordance with operation of said dynamic random access memory in a read cycle and in a write cycle.

According to a second aspect, the present invention provides a read circuit for reading and writing data to and from memory cells of a DRAM, said DRAM including a plurality of pairs of bit lines coupled to said memory cells, input and output data lines for transferring data between said pairs of bit lines and external circuits, and means for generating control signals for use in selectively connecting said pairs of bit lines to said input and output data lines, said read circuit comprising:

- a plurality of sets of column switches, each set consisting of at least two column switches connected in parallel between one of said bit lines and said input and output data lines and controlled mutually independently;
- a plurality of sense amplifiers each coupled to a corresponding one of said pairs of bit lines; and
- column switch control means for controlling said column switches based on said column address control signals, said control being varied in accordance with operation of said DRAM in a read cycle and in a write cycle.

According to a third aspect, the present invention provides a read circuit for reading and writing data to and from memory cells of a DRAM, said DRAM including a plurality of pairs of bit lines coupled to said memory cells, input and output data lines for transferring data between said pairs of bit lines and external circuits, and means for generating column address control signals for use in selectively connecting said pairs of bit lines to said input and output data lines, said read circuit comprising:

- a plurality of column switches controlled by said column address control signals, for transferring data between said pairs of bit lines and input/output data lines;
- a plurality of sets of sense amplifiers, each set comprising at least two sense amplifiers both coupled to a corresponding one of said pairs of bit lines;
- means for transferring supply voltages to said sense amplifiers; and
- means for momentarily interrupting said supply voltage transfer to at least one of said sense amplifiers of said sets during a fixed time interval within each write cycle of said dynamic random access memory.

According to a fourth aspect, the present invention provides a read circuit for reading and writing data to and from memory cells of a DRAM, said DRAM including a plurality of pairs of bit lines coupled to said memory cells, said read circuit comprising:

- a plurality of sets of sense amplifiers, each set corresponding to one of said pairs of bit lines, and each set comprising a plurality of sense amplifiers coupled to said corresponding pair of bit lines;
- means for transferring supply voltages to said sense amplifiers; and
- means for inhibiting operation of at least one of said sense amplifiers of each of said sets during operation of said DRAM in a write cycle.

According to a fifth aspect, the present invention provides a read circuit for reading and writing data to and from memory cells of a DRAM, said DRAM including a plurality of pairs of bit lines each coupled to said memory cells, input and output data lines for transferring data between said pairs of bit lines and external circuits, and means for generating column address control signals for use in selectively connecting said pairs of bit lines to said input and output data lines, said read circuit comprising:

- a plurality of sense amplifiers each coupled to a corresponding one of said pairs of bit lines;
- first and second mutually independent common voltage supply lines, said first common voltage supply line being connected in common to all of said plurality of sense amplifiers;
- a plurality of supply voltage switches each connected between said second common voltage supply line and a corresponding one of said sense amplifiers;
- a plurality of switch control signal supply means for supplying respective control signals to said supply voltage switches, and for varying said control signals in accordance with operation of said dynamic random access memory in a read cycle and in a write cycle.

As a result, with the present invention, the current drive capability of the sense amplifiers can be made sufficiently high during a read cycle to ensure that the aforementioned problem of delays in bit line data amplification is overcome, and without a corresponding increase in current drive capability (and hence junction capacitance) of the column switches occurring, while during a write cycle, the current drive capability of the column switches is made higher than that of the sense amplifiers, thereby ensuring that write-in by data inversion can be executed with a high speed of signal level transitions.

BRIEF DESCRIPTION OF THE DRAWINGS

FIG. 14 is a corresponding waveform diagram.

DESCRIPTION OF PREFERRED EMBODIMENTS

Figure 1:
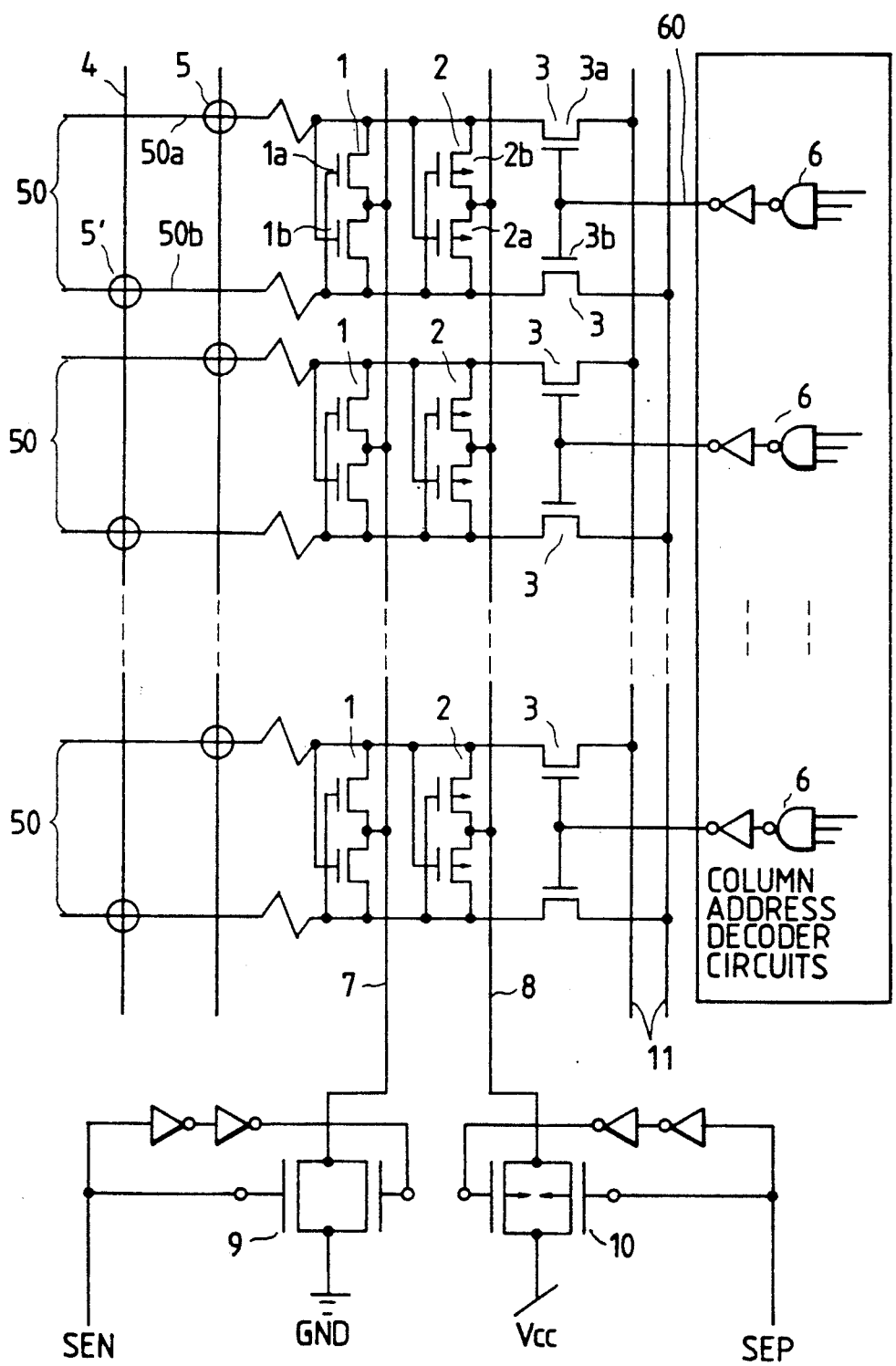
FIG. 1 is a circuit diagram showing a prior art DRAM read circuit.
Figure 2:
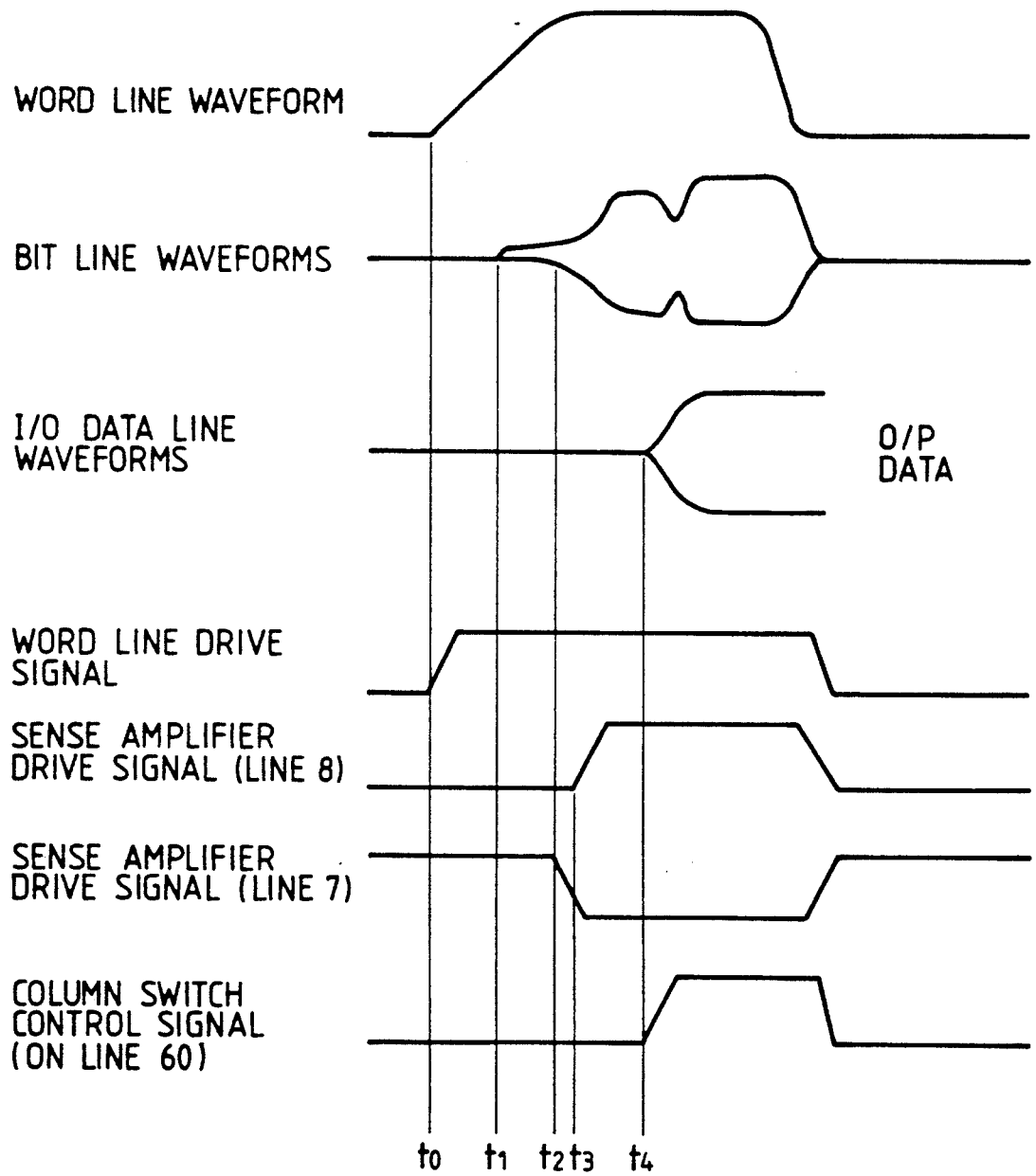
FIGS. 2, 3 and 4 are waveform diagrams for describing the operation of the circuit of FIG. 1.
Figure 3:
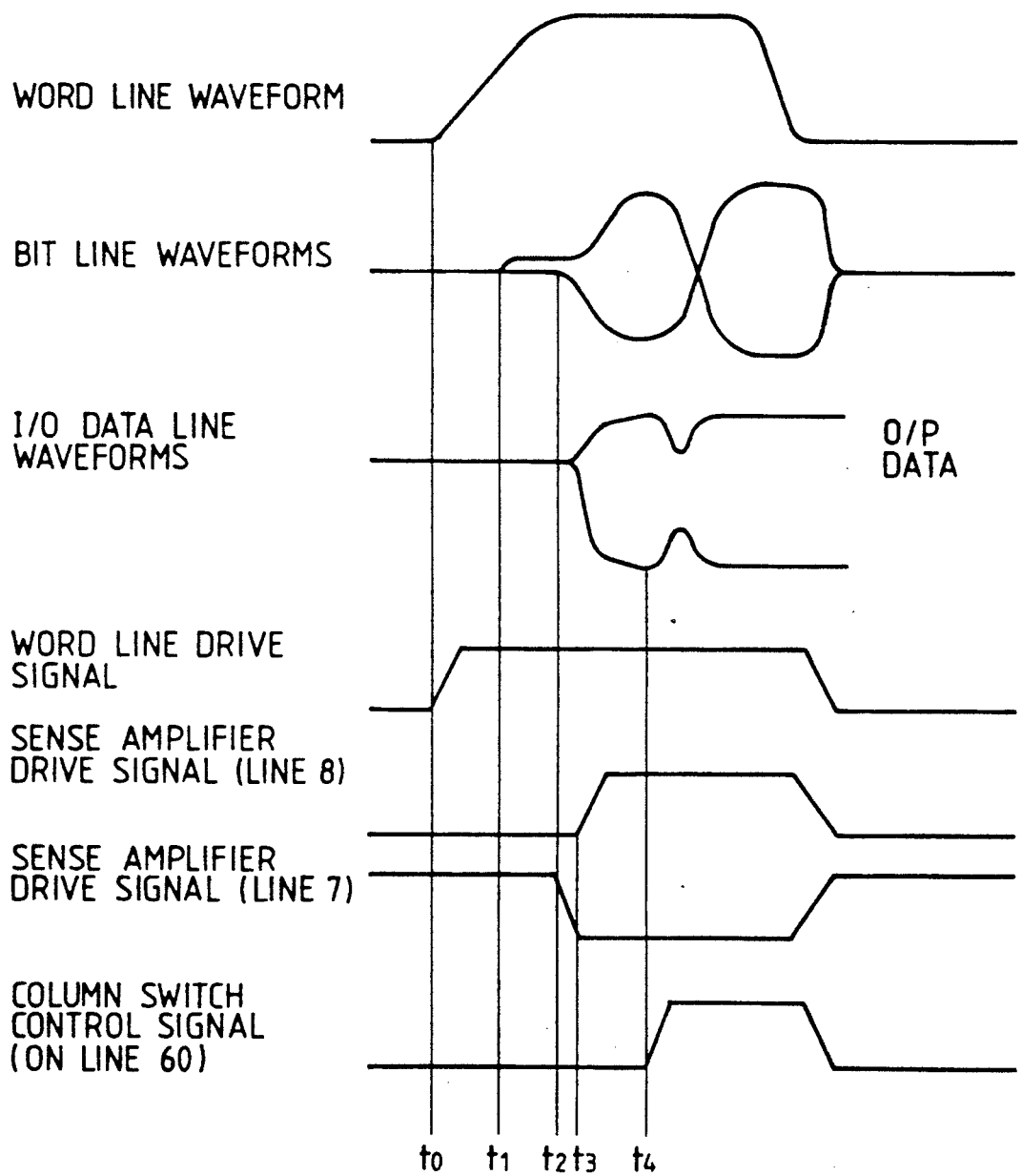
Figure 4:
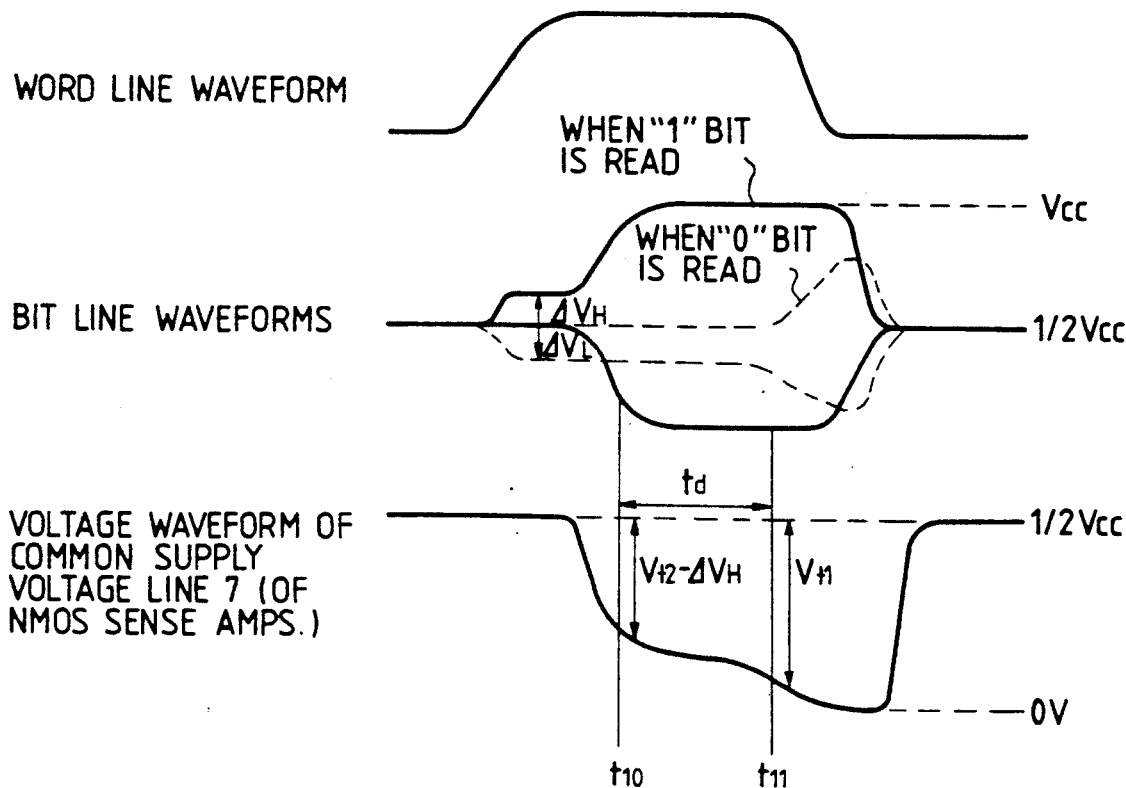
Figure 5:
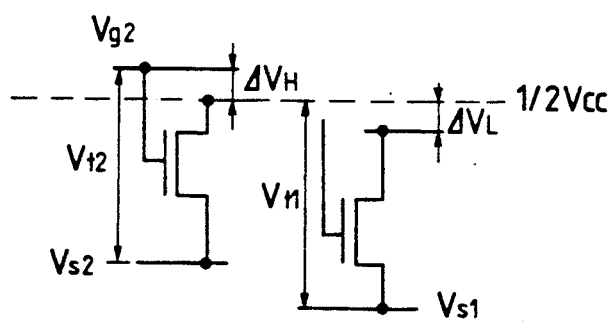
FIG. 5 is a conceptual diagram for illustrating drive operation of a sense amplifier transistor in the circuit of FIG. 1.

In the following, description will be omitted of portions of the embodiments of the present invention which are identical to portions of the prior art example of FIG. 1 described hereinabove, and components in these embodiments which are identical to components in the example of FIG. 1 are indicated by corresponding reference numerals.

Figure 6B:
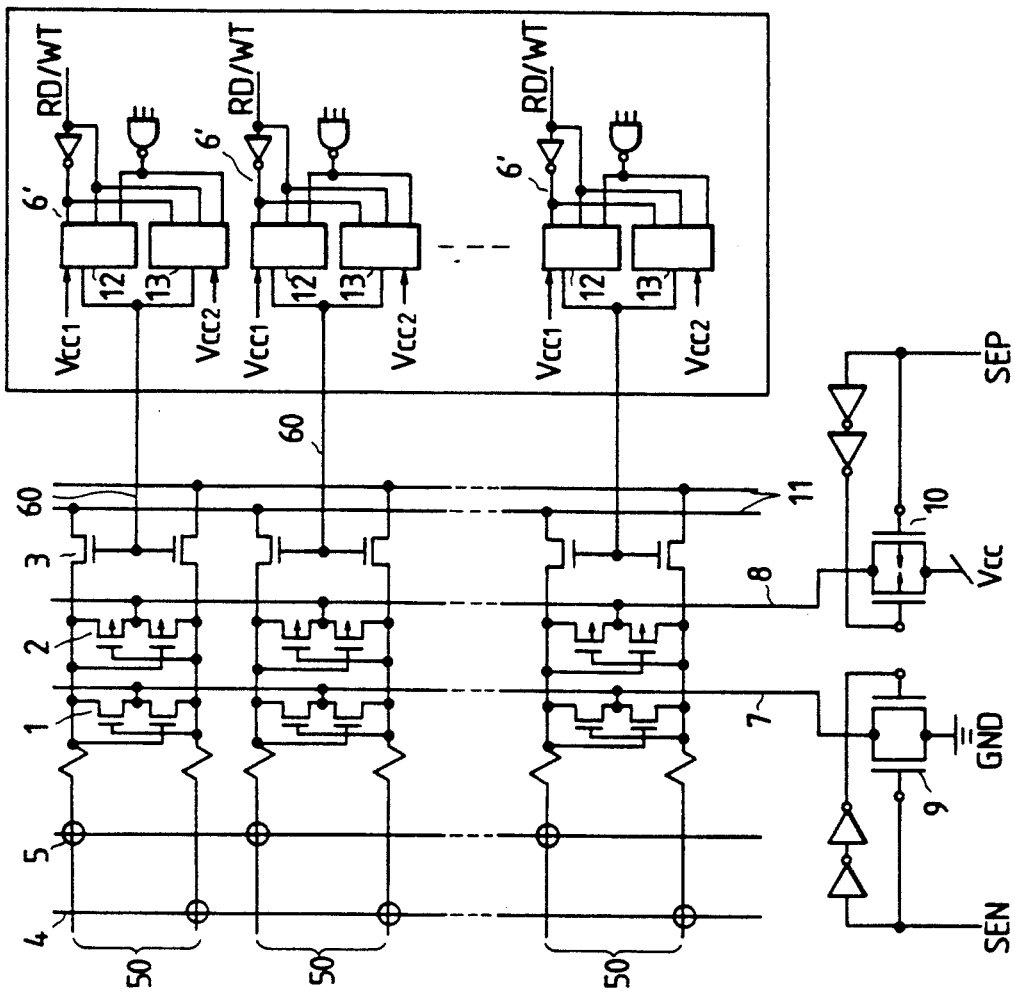
FIGS. 6A, 6B are circuit diagrams showing a first embodiment of a read circuit according to the present invention for a DRAM.
Figure 6A:
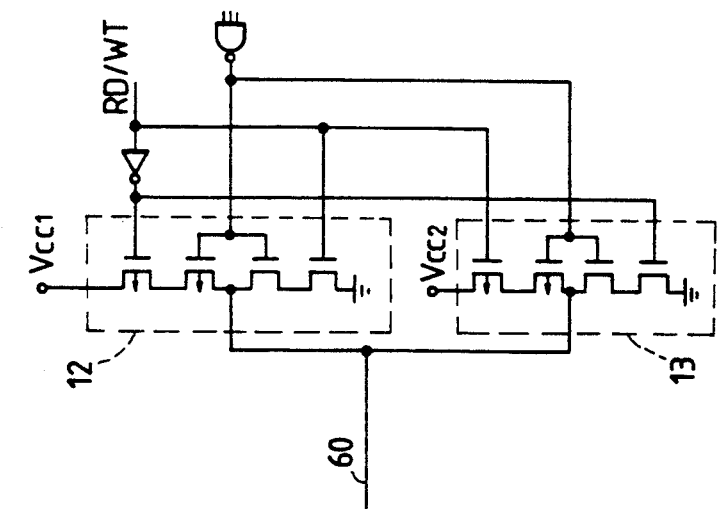
Figure 7:
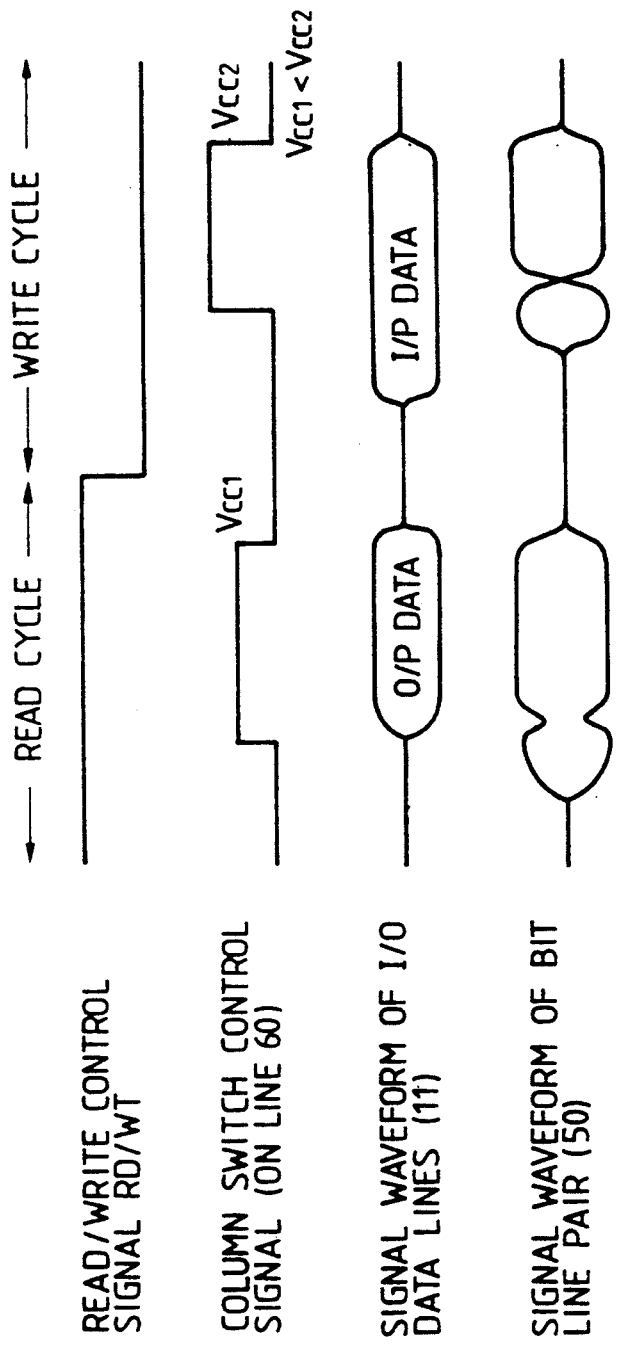
FIG. 7 is a waveform diagram for the embodiment of FIGS. 6A, 6B.

FIGS. 6A and 6B are circuit diagrams of a first embodiment of a read circuit for a DRAM according to the present invention. FIG. 7 is a corresponding waveform diagram. The embodiment of FIGS. 6A, 6B differs from the prior art example of FIG. 1 described hereinabove only with respect to the circuits 6' which supply column address signals to the column switch control lines 60, for controlling selection operation by the column switches 3. Specifically, each of the column switch control lines 60 in FIG. 6B is driven from a pair of control circuits 12 and 13, which are shown in detail in the circuit diagram of FIG. 6A, whereby the supply voltage Vcc1 is supplied to the column switch control line 60 during a read cycle as the column address signal and a supply voltage which is higher than Vcc1, is supplied to the column switch control line 60 as the column address signal during a write cycle. Thus, during a write cycle, each pair of column switches 3 is driven by the high value of gate voltage Vcc2, thereby ensuring that a higher value of current drive capability is achieved for the column switches 3 during a write cycle than during a read cycle. The PMOS FETs of the PMOS sense amplifier flip-flops 2 and the NMOS FETs of the NMOS sense amplifier flip-flops 1 and column switches 3 can thereby be designed such that during a read cycle, the PMOS sense amplifier flip-flops 2 provide a sufficient degree of current drive capability to overcome the aforementioned delay problem (i.e. when a "0" state bit is being read) while the FETs of the column switches 3 can be configured such as to ensure that satisfactory transfer of data from the pairs of bit lines 50 to the input/output data lines 11 will occur, and such that during a write cycle, the column switches 3 provide sufficient current drive capability by comparison with that of the FETs of the PMOS sense amplifier flip-flops 2 to ensure that data write-in (in particular, by data inversion of the previous memory cell contents) can be reliably achieved.

That is to say, the FETs of the PMOS sense amplifier flip-flops 2 can be designed to provide a sufficiently high value of current drive capability to ensure that rapid amplification of the potential difference between a pair of bit lines will be achieved, even in the case in which a "0" bit is being read out while a large number of "1" bits are being read (as described hereinabove), thereby overcoming the aforementioned problem of excessive delay occurring in reading the "0" bits as a result of the initially lower level of gate potential applied to the FETs of the NMOS sense amplifier flip-flops 1. However, in spite of a large value of current drive capability being used for the PMOS FETs of the PMOS sense amplifier flip-flops 2, it does not achieve effective write operation, since during a write cycle, the NMOS FETs constituting the column switches 3 are driven with a higher level of gate voltage than that used during a read cycle, so that a higher current drive capability than that of the PMOS FETs of the PMOS sense amplifier flip-flops 2 is achieved for the column switches 3 during a write cycle.

Moreover, the above effects are obtained without altering the configuration of the NMOS FETs constituting the column switches 3 such as to increase the junction capacitance values of these elements, so that the problem described above of increased capacitance of the input/output data lines 11 does not arise, i.e. the voltage changes occurring on the bit lines will not be substantially absorbed by the capacitance of the input/output data lines 11.

With this embodiment, as shown in FIG. 7, each of the drive voltage control circuits 12 and 13 is coupled to receive the output control signal from corresponding column address decoding circuit 6' and also a read/write control signal RD/WT, with the latter signal being supplied both directly and in inverted form. As shown in FIG. 6A, each of the circuits 12 and 13 is formed of a set of FETs configured as a switch, with the drive voltage control circuit 12 transferring the supply voltage Vcc1 to the column switch control line 60 when the control signal RD/WT is at the read (H) logic level, and with the drive voltage control circuit 13 transferring the supply voltage Vcc2 to the column switch control line 60 when the control signal RD/WT is at the write (L) logic level.

It can thus be understood that this embodiment enables improved read operation to be achieved without a loss of write operation performance, since it enables the respective requirements for satisfactory read and write operation (which in the prior art are mutually conflicting, as described hereinabove) to be satisfied. even in the case of a very large-scale high-density memory configuration.

Figure 8:
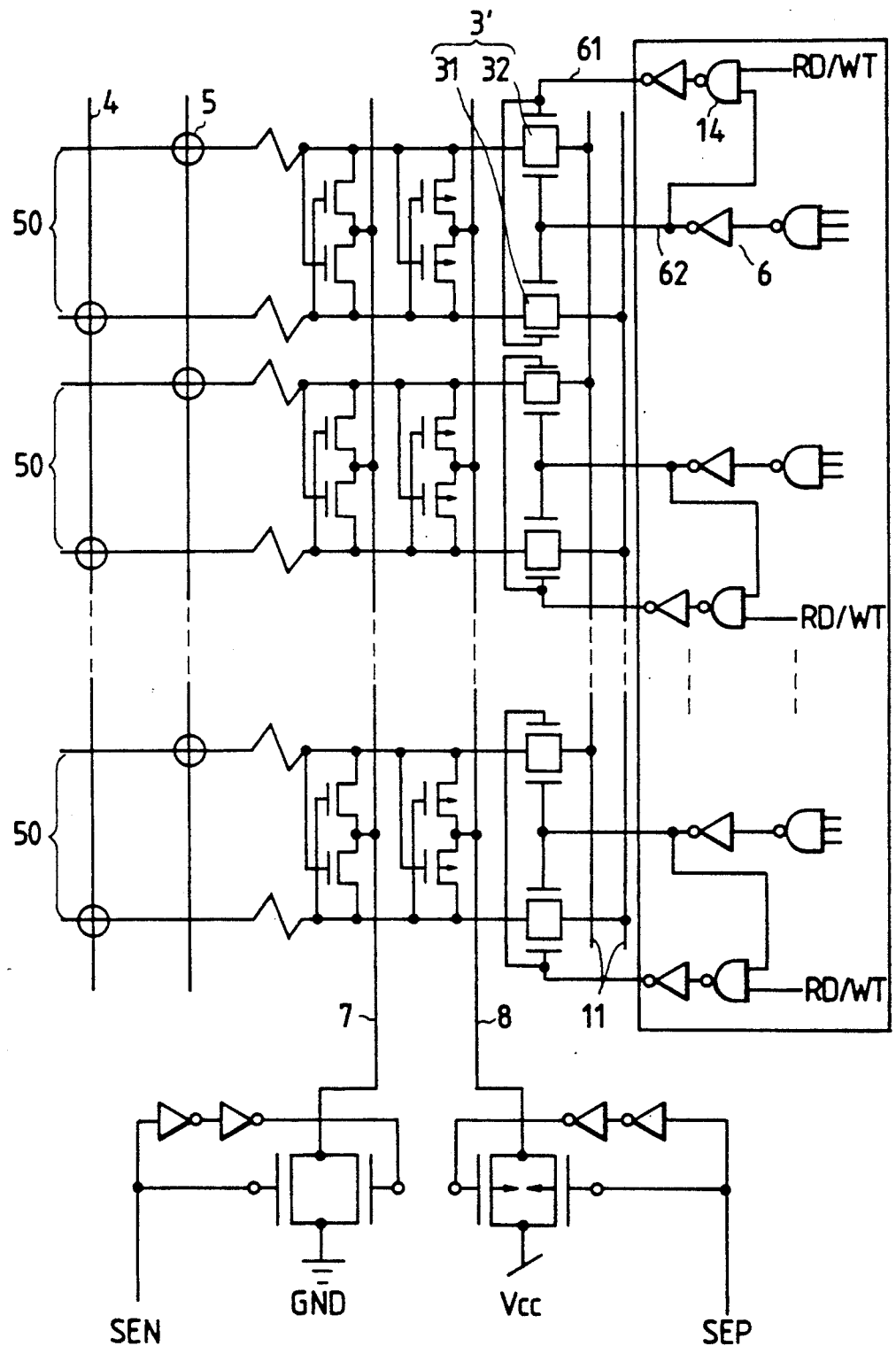
FIG. 8 is a circuit diagram showing a second embodiment of a read circuit according to the present invention.

A second embodiment of a read circuit for a DRAM according to the present invention will now be described, referring to FIG. 8. The effects achieved this embodiment are similar to those of the preceding embodiment. However, with the second embodiment, each of the pair of column switches of a pair of bit lines 50, (each pair of switches being designated as 3' in FIG. 8 and the switches of the pair as 31, 32 respectively) is formed of a pair of NMOS FETs connected in parallel (i.e. with the drain and source electrodes mutually connected). The output column address signal from each column address decoding circuits 6 is transferred directly via a column switch control line 62 to the gate electrodes of one transistor in each of the column switches 31, 32 of the corresponding pair of column switches 3', and is controllably transferred (through logic gate circuit 14) via the column switch control line 61 to the gate electrodes of each of the other transistors of that pair 31, 32. The logic gate circuit 14 is controlled by the read/write signal RD/WT, such that during a read cycle, a drive signal is only supplied via the column switch control line to the transistors 31 of each of the column switches 3', so that a relatively low value of current drive capability is achieved for the column switches 3', i.e. sufficient to ensure satisfactory read operation. During a write cycle, the logic gate circuit 14 supplies a drive voltage via the column switch control line 61 to the other FETs 32 of each of the column switches 3' so that in this case each FET of the pairs of FETs 31, 32 is being driven. A higher value of current drive capability for each of the column switches by comparison with that of the PMOS sense amplifier flip-flops 2 can thereby be achieved during a write cycle, so that satisfactory write operation is ensured.

Figure 9:
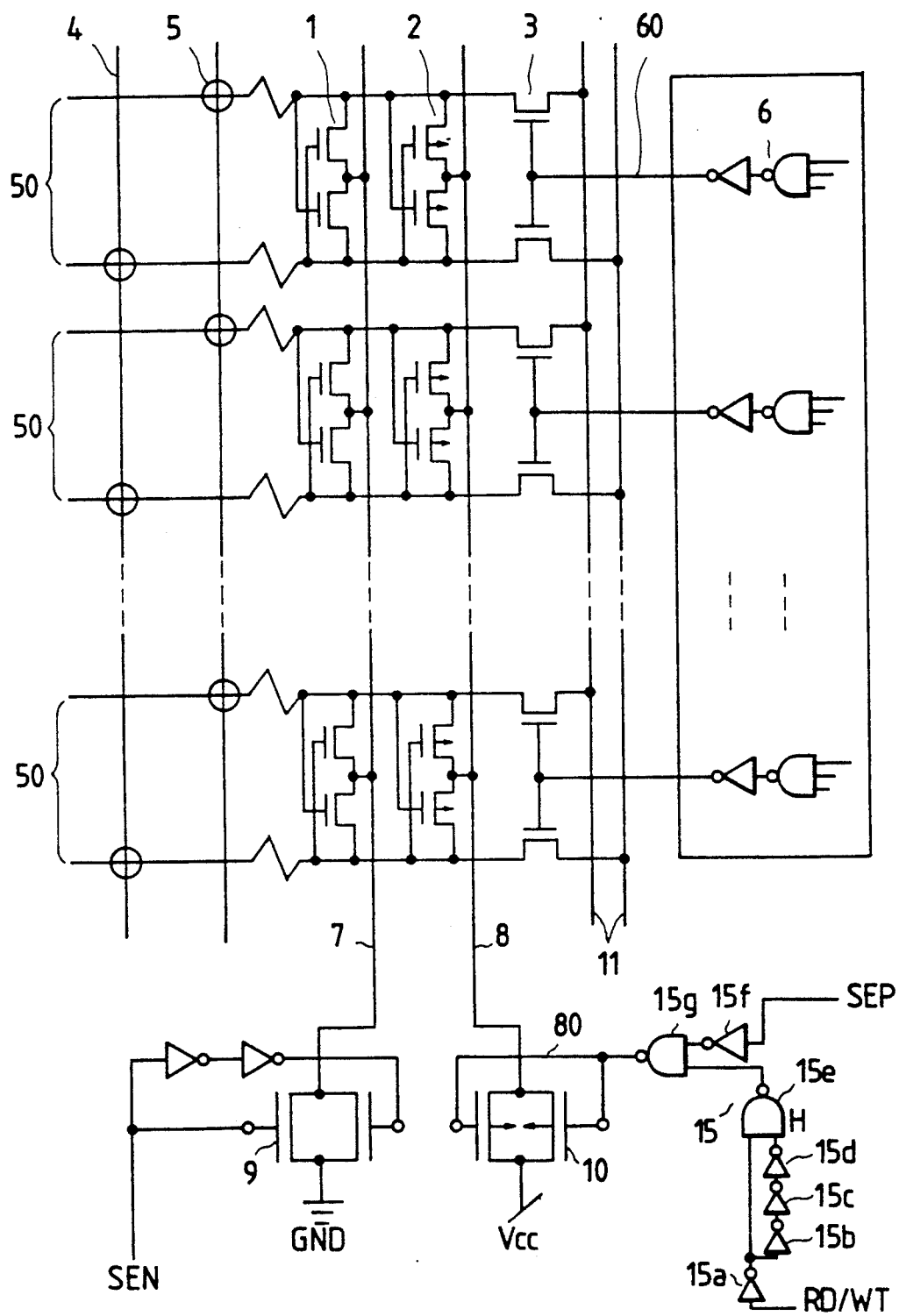
FIG. 9 is a circuit diagram showing a third embodiment of a read circuit according to the present invention.

A third embodiment of a read circuit for a DRAM according to the present invention will be described referring to FIG. 9 and to the corresponding waveform diagram of FIG. 10. With this embodiment, an activation control signal on a control line 80 (for the common voltage supply line 8 which supplies the PMOS sense amplifier flip-flops 2) is held at a non-activation (low) level for a short time interval during each write cycle, 5, i.e. during that interval the voltage supply switch 10 is inhibited from applying the supply voltage Vcc to the common voltage supply line 8. That nonactivation interval corresponds to the time at which a data value that is to be written into a memory cell 5 is being supplied to the input/output data lines 11 to be transferred through the corresponding pair of column switches 3 to the corresponding pair of bit lines 50. The non-activation interval is established by a logic circuit 15 which receives the read/write control signals RD/WT and SEP described hereinabove, and produces the activation control signal on control line 80. The logic circuit 15 in this, embodiment is made up of an inverter 15a which transfers the inverted RD/WT signal to one input of a NAND gate 15e, a set of three inverters connected in series 15b to 15d which transfer the RD/WT signal to the other input of the NAND gate 15e, a NAND gate 15g which receives the output from the NAND gate 15e as one input, and an inverter 15f through which the control signal SEP is applied to the other input of the NAND gate 15g. The output of the NAND gate 15g is applied as the control signal 80 to the gate electrodes of two PMOS FETs connected in parallel which constitute the voltage supply switch 10. The duration of the non-activation interval of signal 80 during each write cycle is determined by the difference between the delay times of the two paths by which the RD/WT control signal is applied to the inputs of NAND gate 15e. In this example, the duration is thereby determined by the delay times of three series-connected inverters. In general, the delay can be established by inserting zero or an even number of inverters in one of the input paths of the NAND gate 15e and a (greater) odd number of inverters in the other input path. Various other methods of establishing such a non-activation interval in each write cycle could of course be envisaged.

Figure 10:
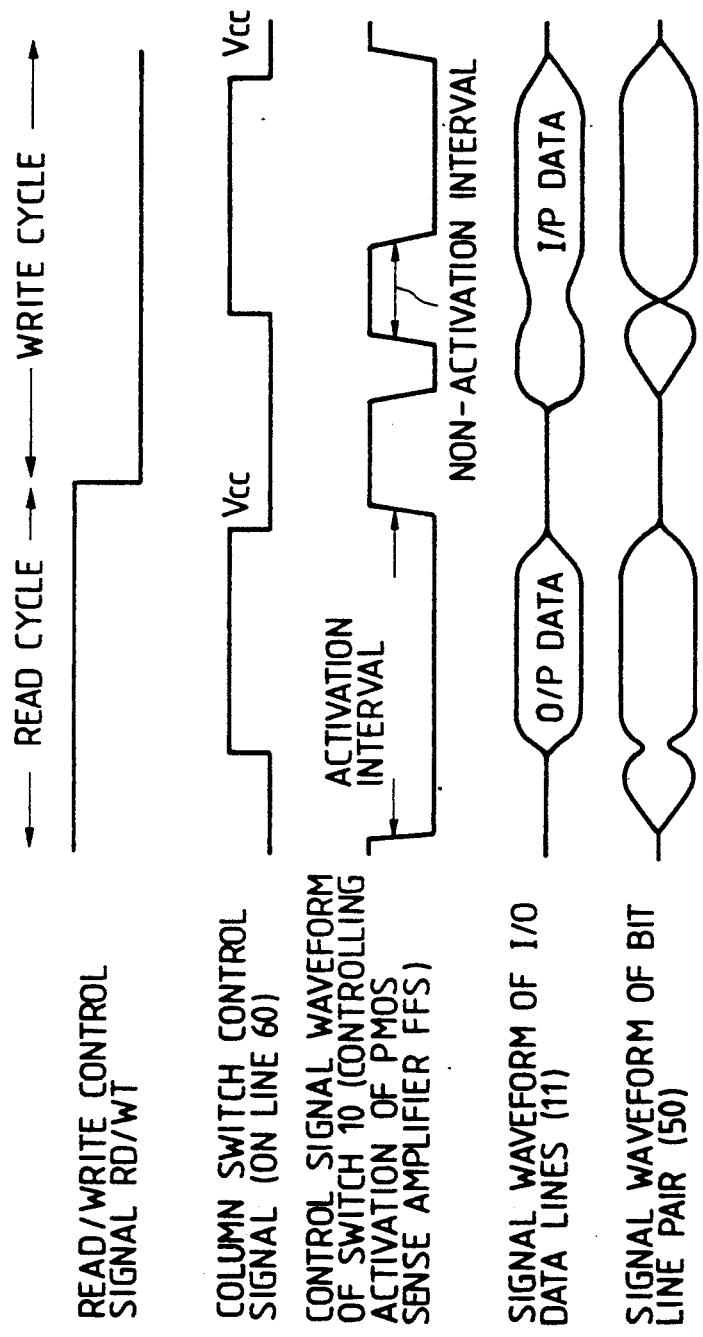
FIG. 10 is a corresponding waveform diagram.

With this embodiment, as illustrated in FIG. 10, each PMOS sense amplifier flip-flop 2 connected to the common voltage supply line 8 is held in a non-activated condition while drive current for writing a data value is being transferred through the input/output data lines 11 and the column switches 3 to a pair of bit lines 50, during a write cycle. Thus, write inversion of the previous data value of the memory cell concerned can be rapidly achieved, since in that condition no current is being supplied by the PMOS sense amplifier flip-flop 2 of that pair of bit lines in a direction opposing the write operation, such as occurs with the prior art circuit of FIG. 1 as described hereinabove. Thus, with this embodiment, the FETs constituting the PMOS sense amplifiers 2 can be designed to provide optimum gain and current drive capability as required to overcome the aforementioned problem of delay when reading a "0" state bit during a read cycle, without regard for the effects of the current drive capability of the PMOS sense amplifier flip-flops during a write cycle. In this way, as for the preceding embodiments, the third embodiment also resolves the mutually conflicting requirements for satisfactory read and write operations in a high-capacity DRAM operating with a low value of supply voltage.

Figure 11:
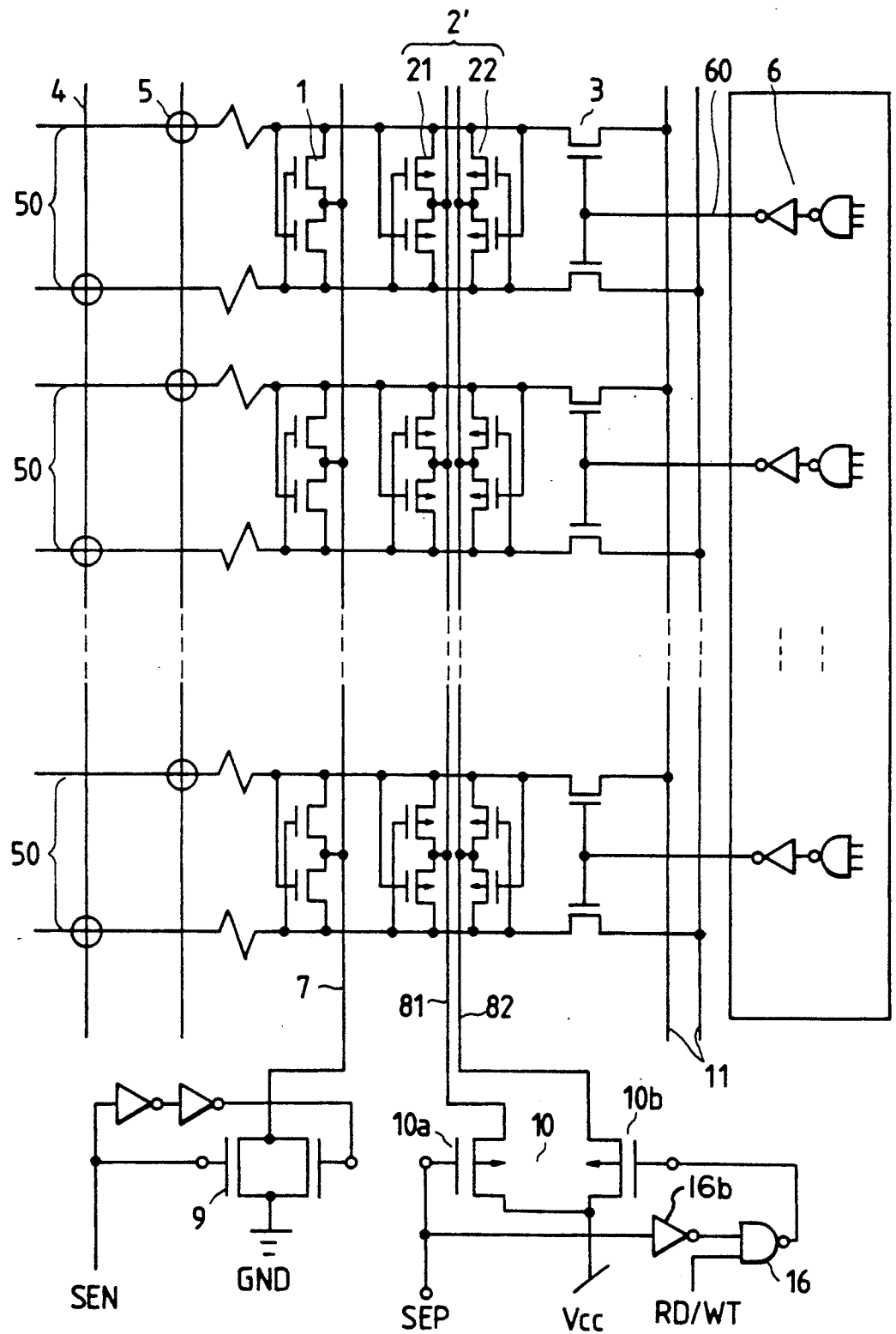
FIG. 11 is a circuit diagram showing a fourth embodiment of a read circuit according to the present invention.
Figure 12:
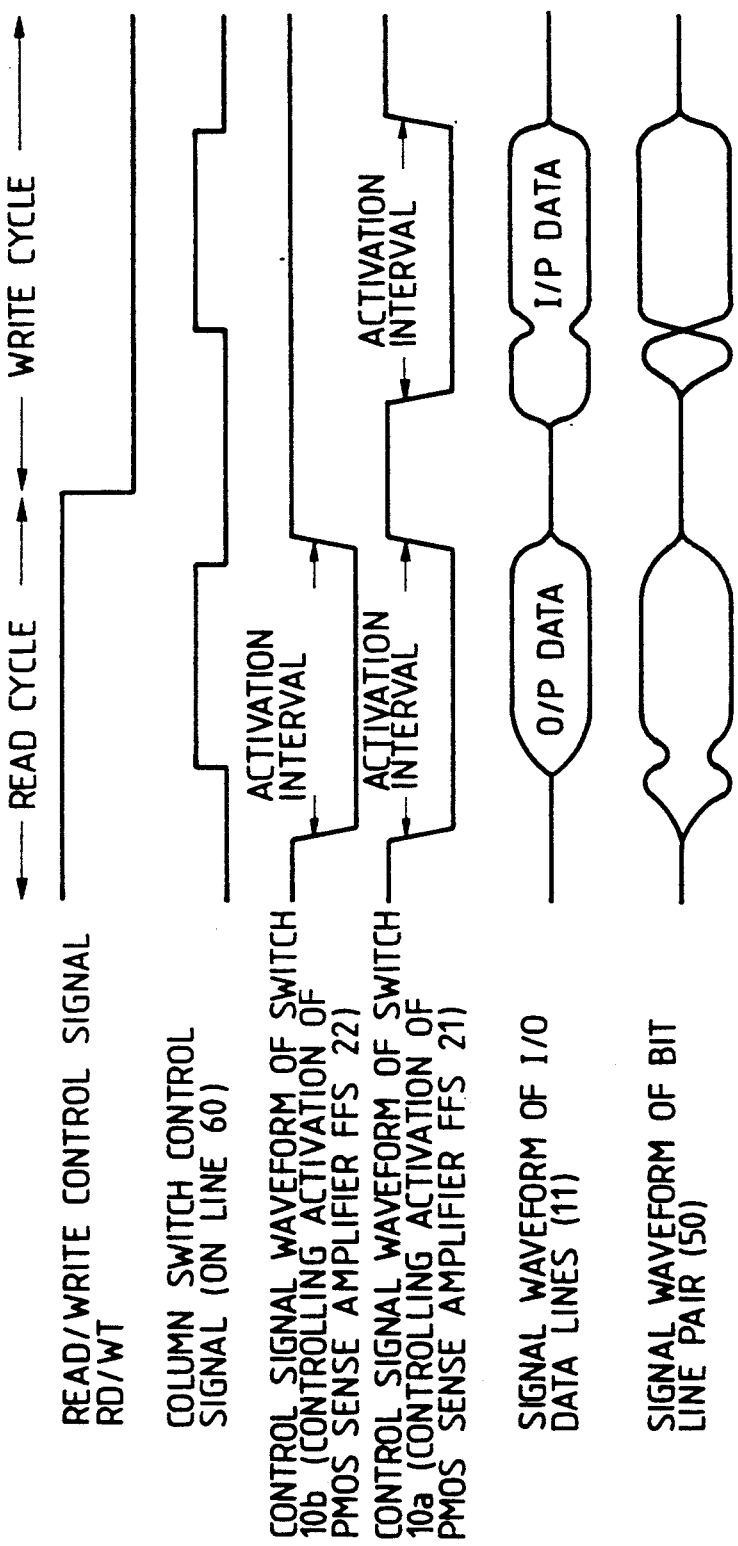
FIG. 12 is a corresponding waveform diagram.

A fourth embodiment of a read circuit for a DRAM according to the present invention will be described referring to FIG. 11 and to the corresponding waveform diagram of FIG. 12. With this embodiment, each of the pairs of bit lines 50 is provided with a pair 2' of PMOS sense amplifier flip-flops 21 and 22, each configured and connected identically to the PMOS sense amplifier flip-flop 2 of the prior art example of FIG. 1. Each common source connection of the flip-flops 21 is coupled to a common voltage supply line 81, while each common source connection of the flip-flops 22 is coupled to a common voltage supply line 82. With this embodiment during a read cycle, both of the flip-flops 21, 22 of a pair 2' are activated, so that twice the current drive capability of a single flip-flop is achieved, while during a write cycle, only one of the flip-flops 21, 22 of a pair 2' is activated. Control of activation of the the sense amplifier flip-flops 21 and 22 is executed by respective PMOS FETs 10a, 10b which function as switches for selectively connecting the supply leads 81, 82 respectively to the Vcc supply potential. This control is achieved by applying the control signal SEP directly to the gate of the FET 10a, applying the signal SEP through an inverter 16b to one input of a 2-input NAND gate 16a and applying the read/write control signal RD/WT to the other input of gate 16a, and applying the output from the gate 16a to the gate electrode of the switch transistor 10b. In this way, the common voltage supply line 82 is set to the activation level during only each read cycle, while the common voltage supply line 81 is set to the activation level during both each read cycle and write cycle. Thus, the NMOS FETs and PMOS FETs of the sense amplifier flip-flops and the column switches 3 can be respectively designed such that a sufficiently high level of current drive capability is achieved for the PMOS sense amplifier flip-flops during a read cycle, while during a write cycle, it can be ensured that the current drive capability of the column switches 3 is sufficiently high in relation to that of the PMOS flip-flops 21 that reliable write-in by inversion of the previous data value of a memory cell can be achieved, i.e. that the drive current of a PMOS flip-flop 21 can be rapidly cancelled by drive current supplied from the input/output data lines 11 through a column switch 3. Thus, similar results are achieved to those of the preceding embodiment, and the embodiment makes it possible to overcome the aforementioned problem of delay when reading a "0" state bit during a read cycle, by enabling the FETs of the PMOS sense amplifier flip-flops to be designed without regard for the effects of the current drive capability of these FETs during a write cycle.

Figure 13:
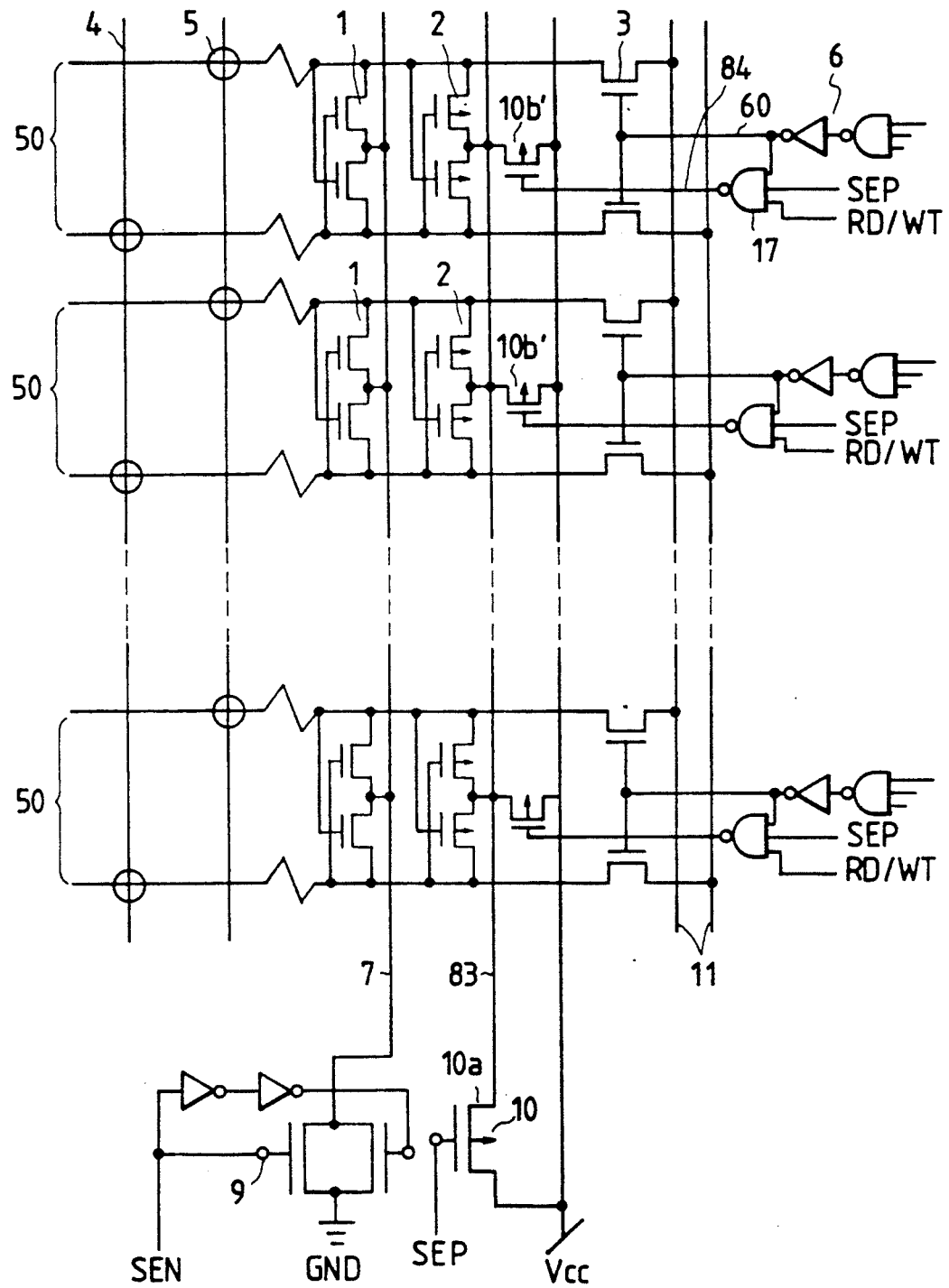
FIG. 13 is a circuit diagram showing a fourth embodiment of a read circuit according to the present invention.

A fifth embodiment of a read circuit for a DRAM according to the present invention will be described referring to FIG. 13 and to the corresponding waveform diagram of FIG. 14. With this embodiment, the PMOS sense amplifier flip-flops 2 are configured as in the prior art example of FIG. 1. However, control of activation of these flip-flops is executed by two mutually independent systems. With one of these systems, control is executed irrespective of the column address signals that are applied to the column switches 3. With the other system, control is selectively executed in accordance with the column address signals. The first of these systems is based on a PMOS FET switch 10a which is controlled by the signal SEP for selectively activating a common voltage supply line 83. The common voltage supply line 83 is connected to the common source connection points of each of the PMOS sense amplifier flip-flops 2 of the respective pairs of bit lines 50. The other system consists of a set of supply voltage switches 10b' each consisting of a PMOS FET and coupled to the common source connection point of a corresponding one of the PMOS sense amplifier flip-flops 2. Each of the supply voltage switches 10b' functions during a read cycle to selectively connect the Vcc voltage to the corresponding PMOS sense amplifier flip-flop 2 in accordance with the column address signals. More specifically, if a pair of bit lines 50 is selected by a column address signal during a read cycle, so that the column address signal of that pair of bit lines (on line 60) goes to the high potential level, then the control line 84 of the corresponding supply voltage switch 10b' goes to the low (ground level) potential so that the switch is set in the closed, i.e. conducting state. As a result, additional drive current for the PMOS sense amplifier flip-flop 2 of that pair of bit lines is provided, thereby increasing the current drive capability of that PMOS flip-flop by comparison with that during a write cycle.

The operation of this embodiment during a write cycle is identical to that of the prior art example of FIG. 1 described above, but with the switch 10a which controls activation of the supply lead 83 consisting of a single PMOS FET 10a which is controlled by the SEP signal. It can thus be understand that this embodiment provides similar results to the preceding embodiments, since the current drive capability of the PMOS sense amplifier flip-flops 2 is made higher during a read cycle than during a write cycle, so that the mutually conflicting requirements for satisfactory write and read operation are resolved.

In this embodiment, control of each of the supply voltage switches 10b' is executed by a corresponding 3-input NAND gate 17, which receives as inputs the read/write control signal RD/WT, the control signal SEP, and the corresponding column address signal on line 60 from the column address decoder circuit 6, and whose output signal is applied via a control line 84 to the gate electrode of that supply voltage switch 10b'. The operating waveforms for one bit line pair 50 are as shown in FIG. 14, with the control line 84 of the bit line pair being set to the activation level only during each read cycle (if that bit line pair is selected for data readout), and with the and the common supply voltage line 83 being set to the activation level both during each write cycle and read cycle.

Although the present invention has been described in the above for the case in which the column switches 3 are constituted by N-type FETs, a similar problem (and similar solution by the present invention) would exist if the column switches 3 were formed of P-type FETs. The basic problem to be solved, irrespective of the polarity of the column switch FETs is that, considering each pair of bit lines 50, a high value of current drive capability (and therefore large size of FET) is required during each write cycle for the column switches of that pair of bit lines, by comparison with the current drive capability of the sense amplifier flip-flop whose FETs are of opposite polarity to those of the column switches, whereas during a read cycle, the column switches should exhibit a low value of junction capacitance (and therefore should be small in size) and the sense amplifier flip-flops should provide a high value of current drive capability, in order to prevent absorption of potential changes of the bit lines by that junction capacitance as data are being transferred from the pair of bit lines to the input/output data lines. It will be apparent that each of the above embodiments of the present invention can overcome this problem, by ensuring that there will be a sufficiently high level of current drive capability by the column switches during a write cycle while also ensuring that during a read cycle, there will be a sufficiently low value of junction capacitance of the column switches and a sufficiently high value of current drive capability of the sense amplifier flip-flop whose FETs are of opposite conduction type to those of the column switches.

It will be further apparent that it would be possible to achieve the objectives of the present invention by various modifications of the embodiments described hereinabove, to achieve similar results to those obtained by the embodiments, and that such modifications would fall within the scope claimed for the present invention.

What is claimed is:

1. A circuit for reading and writing data to and from memory cells of a dynamic random access memory, said dynamic random access memory including a plurality of pairs of bit lines each coupled to said memory cells, input and output data lines for transferring data between said pairs of bit lines and external circuits, and means for generating column address control signals for use in selectively connecting said pairs of bit lines to said input and output data lines, said circuit comprising:
   a plurality of column switches controlled by said column address control signals, for transferring data between said pairs of bit lines and input/output data lines;
   a plurality of sense amplifiers each coupled to a corresponding pair of bit lines; and
   means for establishing a greater value of current drive capability for said column switches than for said sense amplifiers during operation of said dynamic random access memory in a write cycle.

2. A circuit for reading and writing from memory cells of a dynamic random access memory, said dynamic random access memory including a plurality of pairs of bit lines each coupled to said memory cells, input and output data lines for transferring data between said pairs of bit lines and external circuits, and means for generating column address control signals for use in selectively connecting said pairs of bit lines to said input and output data lines, said circuit comprising:
   a plurality of column switches controlled by said column address control signals, for transferring data between said pairs of bit lines and input/output data lines;

a plurality of sense amplifiers each coupled to a corresponding one of said pairs of bit lines; and means for establishing a higher value of amplitude of said column address control signals during operation of said dynamic random access memory in a write cycle than in a read cycle, to produce a higher value of current drive capability for said column switch means than for said read amplifiers during said write cycle.

3. A circuit according to claim 2, wherein each of said column switches comprises respective field effect transistors, and wherein said column address control signals are applied to respective gate electrodes of said field effect transistors.

4. A circuit for reading and writing data to and from memory cells of a dynamic random access memory, said dynamic random access memory including a plurality of pairs of bit lines coupled to said memory cells, input and output data lines for transferring data between said pairs of bit lines and external circuits, and means for generating column address control signals for use in selectively connecting said pairs of bit lines to said input and output data lines, said circuit comprising:

a plurality of sets of column switches, each set consisting of at least two column switches connected in parallel between one of said bit lines and said input nd output data lines and controlled mutually independently.

a plurality of sense amplifiers each coupled to a corresponding one of said pairs of bit lines; and column switch control means for controlling said column switches based on said column address control signals, said control signals being varied in accordance with operation of said dynamic random access memory in a read cycle and in a write cycle so as to produce a higher current drive capability for said column switches than for said read amplifiers during said write cycle;

5. A read circuit according to claim 4, wherein said column switch control means (14) set a greater number of said column switches of a selected pair of bit lines in a closed state during a write cycle than during a read cycle.

6. A circuit for reading and writing data to and from memory cells of a dynamic random access memory, said dynamic random access memory including a plurality of pairs of bit lines coupled to said memory cells, input and output data lines for transferring data between said pairs of bit lines and external circuits, and means for generating column address control signals for use in selectively connecting said pairs of bit lines to said input and output data lines, said circuit comprising:

a plurality of column switches controlled by said column address control signals, for transferring data between respective ones of said pairs of bit lines and said input/output data lines; a plurality of sense amplifiers each coupled to a corresponding one of said pairs of bit lines; and means for establishing a lower value of current drive capability for said sense amplifiers than for said column switches during operation of said dynamic random access memory in a write cycle.

7. A circuit for reading and writing data to and from memory cells of a dynamic random access memory, said dynamic random access memory including a plurality of pairs of bit lines coupled to said memory cells, input and output data lines for transferring data between said pairs of bit lines and external circuits, and means for generating column address control signals for use in selectively connecting said pairs of bit lines to said input and output data lines, said circuit comprising;

a plurality of column switches controlled by said column address control signals, for transferring data between said pairs of bit lines and input/output data lines;

a plurality of sets of sense amplifiers, each set comprising at least two sense amplifiers both coupled to a corresponding one of said pairs of bit lines;

means for transferring supply voltages to said sense amplifiers; and means for momentarily interrupting said supply voltage transfer to at least one of said sense amplifiers of said sets during a fixed time interval within each write cycle of said dynamic random access memory, for thereby producing a higher value of current drive capability for each of said column switches than for each of said sets of sense amplifiers during said each write cycle.

8. A read circuit according to claim 7, wherein each of said column switches (3) is configured as at least one field effect transistor of a first conduction type, wherein each of said sets of sense amplifiers consists of a first sense amplifier (1) configured as a flip-flop formed of field effect transistors of said first conduction type and a second sense amplifier (2) configured as a flip-flop formed of field effect transistors of a second conduction type, said means for supply voltage transfer includes a common voltage supply line (8) for transferring a supply voltage to each second sense amplifier (2) of said plurality of sets of sense amplifiers, and wherein said supply voltage transfer interruption means includes switch means (10) coupled to said common voltage supply line.

9. A circuit for reading and writing data to and from memory cells of a dynamic random access memory, said dynamic random access memory including a plurality of pairs of bit lines coupled to said memory cells, said circuit comprising:

input and output data lines for transferring data between a selected one of said pairs of bit lines and external circuits;

means for generating column address control signals for use in selectively connecting said pairs of bit lines to said input and output data lines in accordance with column address signals;

a plurality of column switches controlled by aid column address control signals for transferring data between said pairs of bit lines and input/output data lines;

a plurality of sets of sense amplifiers, each set corresponding to one of said pairs of bit lines, and each set comprising a plurality of sense amplifiers coupled to said corresponding pair of bit lines;

means for transferring supply voltages to said sense amplifiers; and means for inhibiting operation of at least one of said sense amplifiers of each of said sets during operation of said dynamic random access memory in a write cycle, for thereby producing a higher value of current drive capability for each of said column switches than for each of said sets of sense amplifiers during said operation in a write cycle.

10. A read circuit according to claim 9, and further comprising input and output data lines for transferring data between a selected one of said pairs of bit lines and external circuits, means for generating column address control signals for use in selectively connecting said pairs of bit lines to said input and output data lines in accordance with column addresses, and a plurality of column switches (3) controlled by said column address control signals, for transferring data between said pairs of bit lines and input/output data lines, wherein each of said column switches is configured as at least one field effect of a first conduction type, wherein each of said sets of sense amplifiers consists of at least a first sense amplifier (1) configured as a flip-flop formed of field effect transistors of said first conduction type and second and third sense amplifiers (21,22) each configured as a flip-flop formed of field effect transistors of a second conduction type, said means for supply voltage transfer includes respective common voltage supply lines (81, 82) for transferring supply voltages to each second and third sense amplifier (21, 22) of said plurality of sets of sense amplifiers, and wherein said operation inhibiting means includes switch means (10b) coupled to one of said common voltage supply lines of said second and third sense amplifiers for selectively interrupting connection of a supply voltage to said common voltage supply line.

11. A read circuit for reading and writing data to and from memory cells of a dynamic random access memory, said dynamic random access memory including a plurality of pairs of bit lines each coupled to said memory cells, input and output data lines for transferring data between said pairs of bit lines and external circuits, and means for generating column address control signals for use in selectively connecting said pairs of bit lines to said input and output data lines, said read circuit comprising:

a plurality of sense amplifiers (2) each coupled to a corresponding one of said pairs of bit lines;

first and second mutually independent common voltage supply lines (83, 84), said first common voltage supply line (83) being connected in common to all of said plurality of sense amplifiers (2);

a plurality of supply voltage switches (10b') each connected between said second common voltage supply line (84) and a corresponding one of said sense amplifiers;

a plurality of switch control signal supply means (17) for supplying respective control signals to said supply voltage switches, and for varying said control signals in accordance with operation of said dynamic random access memory in a read cycle and in a write cycle.

12. A read circuit according to claim 11, wherein each of said switch control signal supply means (17) is responsive to said column address control signals for supplying to a corresponding one of said supply voltage switches a control signal for connecting a corresponding one of said sense amplifiers to said second common voltage supply line only when said sense amplifier is selected by said column address control signals, and wherein said supply voltage switch control signal supply means inhibits transfer of said supply voltage switch control signal during operation of said dynamic random access memory in a write cycle.

* * * * *